(12) United States Patent
Yomori

(10) Patent No.: US 9,276,028 B2
(45) Date of Patent: Mar. 1, 2016

(54) SEMICONDUCTOR DEVICE INCLUDING PIXELS, MICROLENSES, AND A MONITORING STRUCTURE, AND A METHOD OF MANUFACTURING THE SAME

(75) Inventor: Mitsuhiro Yomori, Ebina (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/611,375

(22) Filed: Sep. 12, 2012

(65) Prior Publication Data

US 2013/0087874 A1 Apr. 11, 2013

(30) Foreign Application Priority Data

Oct. 7, 2011 (JP) .................................. 2011-223300

(51) Int. Cl.
*H01L 31/0232* (2014.01)
*H01L 27/146* (2006.01)
*G02B 3/00* (2006.01)

(52) U.S. Cl.
CPC ........ *H01L 27/14627* (2013.01); *G02B 3/0056* (2013.01); *H01L 27/14685* (2013.01)

(58) Field of Classification Search
CPC .................................................. H01L 27/14627
USPC .......................................... 257/432, E31.127
See application file for complete search history.

(56) References Cited

U.S. PATENT DOCUMENTS

| 2006/0146412 A1* | 7/2006 | Kim .............................. 359/622 |
| 2007/0246639 A1* | 10/2007 | Yu ................................ 250/208.1 |
| 2007/0284510 A1* | 12/2007 | Li et al. ...................... 250/208.1 |
| 2011/0130508 A1* | 6/2011 | Pendley ........................ 524/507 |

FOREIGN PATENT DOCUMENTS

JP 2006-351853 A 12/2006

OTHER PUBLICATIONS

Machine translation of Yasuumi, JP 2006-351853 A.*

* cited by examiner

*Primary Examiner* — Hsin-Yi Hsieh
(74) *Attorney, Agent, or Firm* — Canon USA, Inc. I.P. Division

(57) ABSTRACT

A semiconductor device includes a microlens provided in a pixel area and a monitoring structure provided in a peripheral area that is separate from the pixel area. The monitoring structure has a shape correlated with a shape of the microlens. A shape of a section of the monitoring structure in a plane perpendicular to a substrate is constant.

14 Claims, 8 Drawing Sheets

SEMICONDUCTOR DEVICE INCLUDING PIXELS, MICROLENSES, AND A MONITORING STRUCTURE, AND A METHOD OF MANUFACTURING THE SAME

BACKGROUND OF THE INVENTION

1. Field of the Invention

The present invention relates to a semiconductor device and a method of manufacturing the same.

2. Description of the Related Art

Some semiconductor devices, for example, solid-state image pickup devices such as charge-coupled-device (CCD) sensors and complementary-metal-oxide-semiconductor (CMOS) sensors and liquid-crystal display devices, include microlenses (also referred to as on-chip lenses) for improvement of sensitivity.

According to Japanese Patent Laid-Open No. 2006-351853, a monitoring structure having a hemispherical shape is provided in a peripheral area of a chip. The monitoring structure is used in measuring the quality of a microlens included in an image pickup device. The surficial shape of the monitoring structure intended for the monitoring of the microlens is measured through an atomic-force microscope (AFM), whereby any irregularities that may occur in a process of forming the microlens, i.e., any irregularities in the shape of the microlens, are detected.

In the detection of the shape of a microlens, the sectional shape, the radius of curvature, and the height of the microlens are important. In Japanese Patent Laid-Open No. 2006-351853, since the monitoring structure intended for the monitoring of the microlens has a hemispherical shape, raster scanning needs to be performed with an AFM. The shapes of different sections of the monitoring structure obtained through the raster scanning with an AFM are integrated together, whereby the sectional shape, the radius of curvature, and the height of the microlens are calculated. In the raster scanning performed with an AFM, however, there is a possibility that the scanning may not be performed along a line passing through the vertex (top) of the microlens. Therefore, an accurate sectional shape and other dimensional information may not be acquired, resulting in measurement errors. Although such measurement errors can be reduced by reducing the spacing of scanning lines, such reduction in the spacing of scanning lines is limited. Moreover, if the spacing of scanning lines is reduced, the number of scanning lines increases. Consequently, the measurement time increases.

SUMMARY OF THE INVENTION

According to a first aspect of the present invention, there is provided a semiconductor device including a microlens provided in a pixel area and a monitoring structure provided in a peripheral area that is separate from the pixel area. The monitoring structure has a shape correlated with a shape of the microlens. The monitoring structure includes a portion that extends in a predetermined direction and has a bottom surface. A shape of a section of the portion that is taken in a direction perpendicular to the bottom surface and is orthogonal to the predetermined direction is substantially constant over an entirety of the portion.

According to a second aspect of the present invention, there is provided a method of manufacturing a semiconductor device. The semiconductor device includes a microlens provided in a pixel area in which a pixel is provided and a monitoring structure provided in a peripheral area that is separate from the pixel area. The monitoring structure includes a portion that extends in a predetermined direction and has a bottom surface. A shape of a section of the portion that is taken in a direction perpendicular to the bottom surface and is orthogonal to the predetermined direction being substantially constant over an entirety of the portion. The method includes simultaneously forming the monitoring structure and the microlens.

Further features of the present invention will become apparent from the following description of exemplary embodiments with reference to the attached drawings.

DESCRIPTION OF THE EMBODIMENTS

A semiconductor device according to a general embodiment of the present invention includes a microlens provided in a pixel area and a monitoring structure provided in an area separate from the pixel area. The three dimensional form of the microlens may be a spherical cap, a dome, a torispherical dome, a plano-convex lens, or some other three dimensional form. The monitoring structure has a shape correlated with the shape of the microlens. Specifically, the monitoring structure has a bottom surface, and a shape of a cross section of the monitoring structure taken in a direction perpendicular to the bottom surface is constant over the entirety of the monitoring structure in a direction orthogonal to the cross section. Alternatively, the monitoring structure includes at least a portion that has a rectangular bottom surface, and the shape of a cross section of the portion of the monitoring structure is constant over the entirety of the portion in the direction perpendicular to the cross section. That is, the monitoring structure includes a portion having a cross-sectional shape that is constant over a predetermined length. For example, the monitoring structure has a shape of a cylindrical lens including a semicylindrical shape. With such a monitoring structure, the shape of the microlens can be measured with high accuracy and in a reduced time through scanning with an atomic-force microscope (AFM) or the like.

The term "constant" used herein for describing the cross-sectional shape of the monitoring structure implies that the monitoring structure is designed and formed to have a constant cross-sectional shape, ignoring any differences in the shape due to errors and so forth that may occur in the manufacturing process.

Specific embodiments of the present invention will now be described in detail with reference to the accompanying drawings.

First Embodiment

A first embodiment of the present invention concerns a semiconductor device as a photoelectric conversion device and will be described with reference to FIGS. 1A, 1B, 2, 3A, 3B, 3C, 6A, and 6B. First, the positional relationship between the microlens and the monitoring structure will be described with reference to FIG. 2, which is a schematic plan view of a semiconductor wafer.

Figure 2:
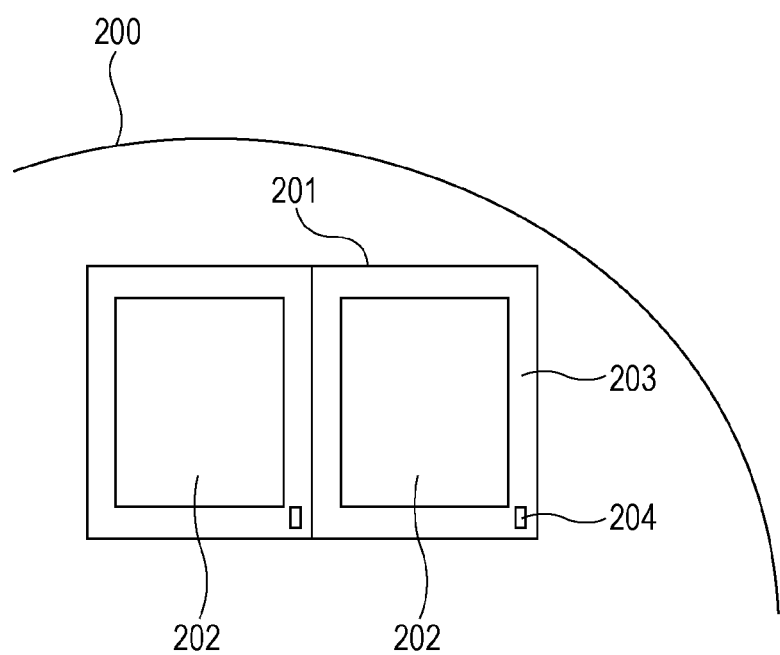
FIG. 2 is a schematic plan view of a semiconductor wafer according to the first embodiment.

FIG. 2 is a plan view illustrating a layout of semiconductor chips 201 provided on a semiconductor wafer 200. FIG. 2 illustrates the contours and the like of the semiconductor chips 201 projected on a surface of the semiconductor wafer 200. In FIG. 2, only two semiconductor chips 201 are illustrated on the semiconductor wafer 200 as a matter of convenience. Practically, a number of semiconductor chips 201 are provided on the semiconductor wafer 200.

The semiconductor chips 201 each include a pixel area 202 in which pixels 104 (see FIG. 1A) are provided, and a peripheral area 203 that is separate from the pixel area 202. A drive circuit that reads signals from the pixel area 202, a signal processing circuit that processes the signals from the pixel area 202, terminals (pads) that provide connections to external circuits, and so forth are provided in the peripheral area 203. Microlenses 105 (see FIG. 1A) according to the first embodiment are provided in correspondence with the pixels 104 in the pixel area 202. Monitoring structures 115 (see FIG. 1B) according to the first embodiment are provided in a monitoring area 204 included in the peripheral area 203. The monitoring structures 115 are provided in the monitoring area 204, which is separate from the pixel area 202 relating to image formation. Therefore, even if any of the monitoring structures 115 are damaged during measurement, the influence of the damage to the image is suppressed to be small.

Figure 1A:
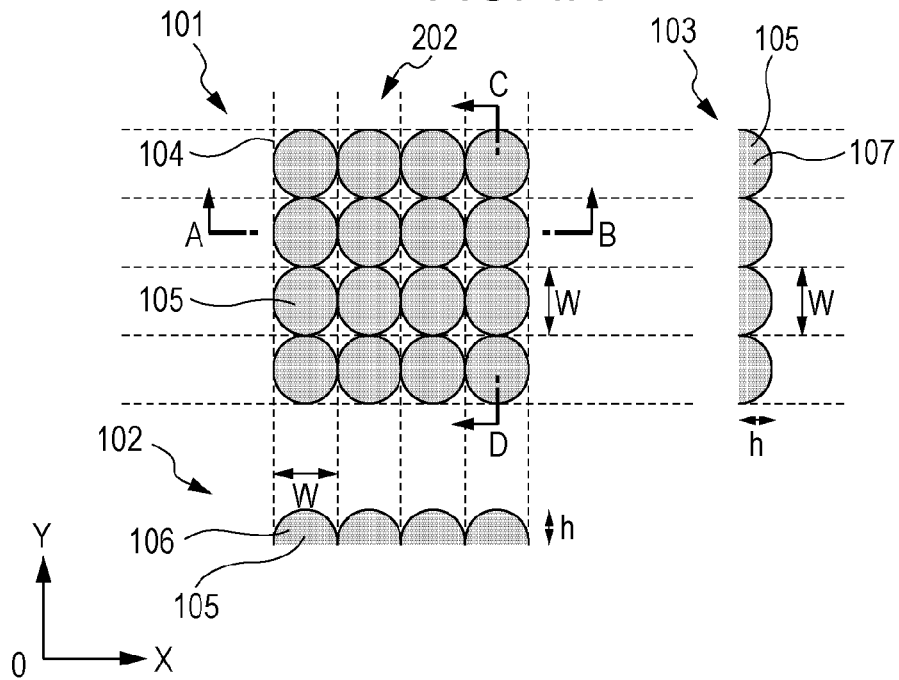
FIG. 1A includes a schematic plan view and schematic sectional views of microlenses according to a first embodiment of the present invention.

The shapes of the microlenses 105 and the monitoring structures 115 will now be described with reference to FIGS. 1A and 1B. FIG. 1A illustrates the microlenses 105 in the forms of a plan-view configuration 101, a sectional configuration 102 taken along line A-B defined in the plan-view configuration 101, and a sectional configuration 103 taken along line C-D defined in the plan-view configuration 101. The plan-view configuration 101 of the microlenses 105 is also regarded as a projection from above. The plan-view configuration 101 illustrated in FIG. 1A corresponds to part of the pixel area 202, in which pixels 104 are two-dimensionally provided. A length W denotes the length of one side of each pixel 104 and is equal to the pixel pitch. The pixel pitch is the length of a virtual line that connects the center of one pixel 104 and the center of another pixel 104 adjacent thereto in the plan-view configuration 101. In the first embodiment, the pixels 104 each has a square shape. Since the length W of each pixel 104 is equal to the pixel pitch, the length W of the pixel 104 is taken herein for easy understanding. The shape of the pixel 104 is not limited to a square. The length W of the pixel 104 may be defined as the length of one side, the diameter, or the diagonal of any shape forming the pixel 104.

In the first embodiment, one microlens 105 is provided for each of the pixels 104. That is, a microlens array is provided in the pixel area 202, and the microlenses 105 are arranged at a pitch equal to the length W, as with the pixels 104. Each microlens 105 has a circular shape when seen from above as in the plan-view configuration 101. The microlens 105 has a semicircular sectional shape 106 with a height h in the sectional configuration 102 and a semicircular sectional shape 107 with the height h in the sectional configuration 103. That is, the microlens 105 has a hemispherical shape with the height h. The microlens 105 may alternatively have another plan-view shape such as an elliptical or rectangular shape. Referring to FIG. 1A, the plurality of microlenses 105 are in contact with one another with no gaps. The term "sectional shape" used herein refers to a shape in a plane (section) perpendicular to the surface of a semiconductor substrate included in the semiconductor device, or a shape in a plane (section) perpendicular to the bottom surface of the microlens 105.

Figure 1B:
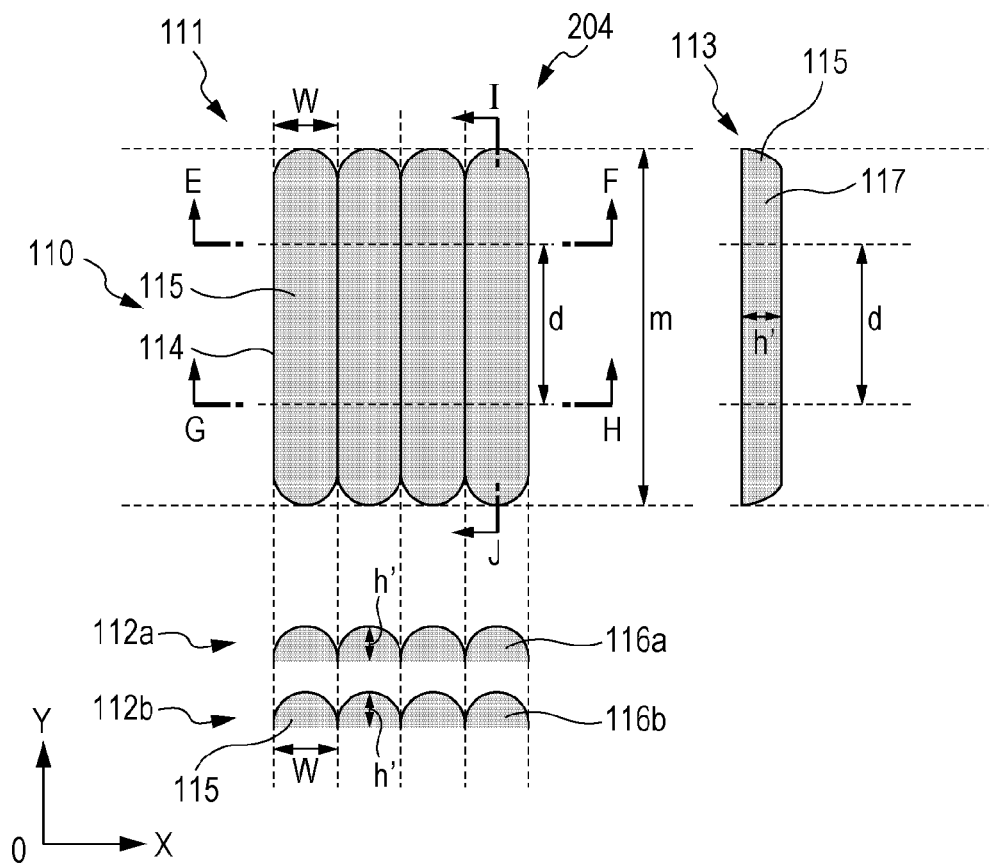
FIG. 1B includes a schematic plan view and schematic sectional views of monitoring structures according to the first embodiment.

Referring to FIG. 1B, a monitoring-structure group 110 is provided in the monitoring area 204. The monitoring-structure group 110 includes at least one monitoring structure 115. The monitoring structure 115 has a cross-sectional shape that is constant over a certain length. As can be seen from a plan-view configuration 111 illustrated in FIG. 1B, the monitoring structure 115 has an elliptical plan-view shape defined by the length W and a length m. The monitoring structure 115 includes a portion 114 that has a constant cross-sectional shape. The portion 114 has a rectangular plan-view shape defined by a length d and the length W. Two sides of the portion 114 coincide with line E-F and line G-H, respectively. The shape of the monitoring structure 115 in the portion 114 will now be described referring to a sectional configuration 112 and a sectional configuration 113. The sectional configuration 112 includes a sectional configuration 112$a$ and a sectional configuration 112$b$.

In the sectional configuration 112$a$ taken along line E-F defined in the plan-view configuration 111, the monitoring structure 115 has a semicircular shape 116$a$. In the sectional configuration 112$b$ taken along line G-H defined in the plan-view configuration 111, the monitoring structure 115 has a semicircular shape 116$b$. That is, the monitoring structure 115 has a constant semicircular cross-sectional shape in the portion 114 having a rectangular plan-view shape. In the sectional configuration 113 taken along line I-J that is orthogonal to lines E-F and G-H, the monitoring structure 115 has a sectional shape 117. The sectional shape 117 has a constant height h' in the portion 114 (the portion defined by the length d). The height h' has a correlation with the height h of the microlens 105 illustrated in FIG. 1A. The length d is larger than a value corresponding to the Y-direction resolution of a measuring device such as an AFM. For example, the relationship between the length W that is equal to the pitch of the microlenses 105 and the length m of the monitoring structure 115 in the longitudinal direction is expressed as W<m. The length d of the portion 114 is expressed as W≤d<m. The length d may be larger than or equal to the length W and smaller than or equal to 500 times the length W (W≤d≤500 W). If the monitoring structure 115 is too long, the monitoring structure 115 is difficult to arrange on a chip of a semiconductor device. Therefore, the length d can be set to a value smaller than or equal to the length of the array of pixels 104 provided in the pixel area 202. For example, in a case where a two-dimensional matrix of pixels 104 provided in the pixel area 202 includes 500 pixels 104 in each row, the length d can be set to a value smaller than or equal to the total length of the 500 pixels 104, i.e., 500 times the length W. More specifically, supposing that the length W is 1.86 μm and 100 pixels 104 are provided in each row, the length d of the portion 114 can be set to about 180 μm. In such a case, the length m of the monitoring structure 115 in the longitudinal direction is about 190 μm.

Figure 3A:
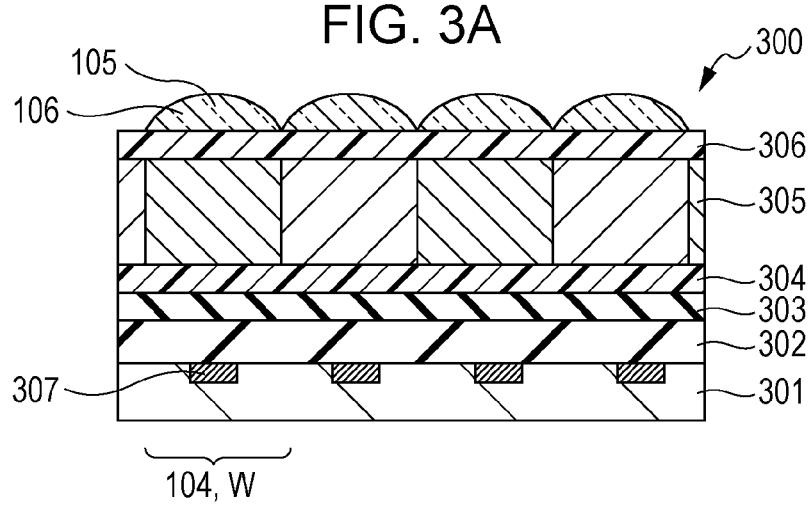
FIG. 3A is a schematic sectional view of a photoelectric conversion device according to the first embodiment.
Figure 3B:
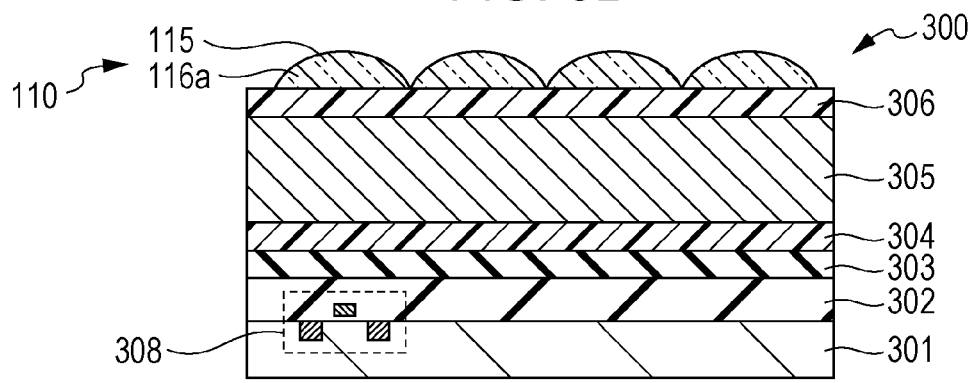
FIG. 3B is another schematic sectional view of the photoelectric conversion device according to the first embodiment.
Figure 3C:
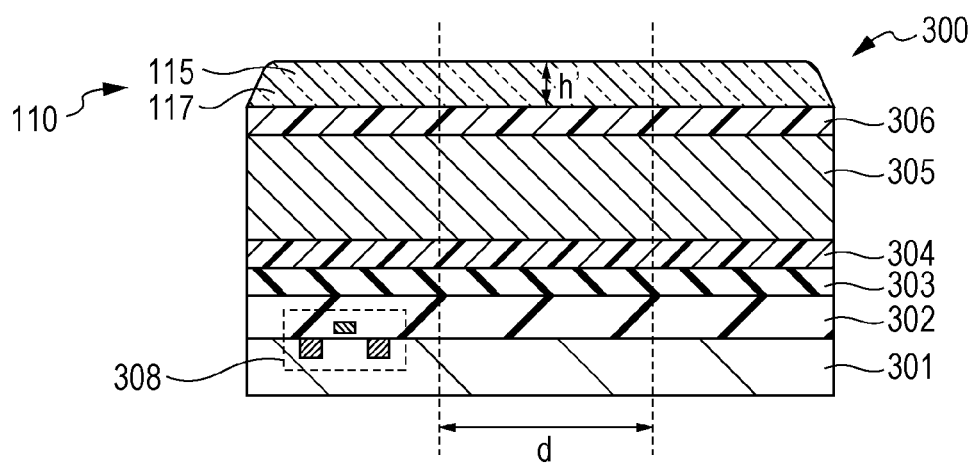
FIG. 3C is yet another schematic sectional view of the photoelectric conversion device according to the first embodiment.

Referring to FIGS. 3A, 3B, and 3C, a photoelectric conversion device 300 including microlenses 105 and a monitoring-structure group 110 will now be described. FIG. 3A is a schematic sectional view of the photoelectric conversion device 300, inclusive of a semiconductor substrate 301, taken along line A-B defined in the plan-view configuration 101 illustrated in FIG. 1A. FIG. 3B is a schematic sectional view of the photoelectric conversion device 300, inclusive of the semiconductor substrate 301, taken along line E-F defined in the plan-view configuration 111 illustrated in FIG. 1B. FIG. 3C is a schematic sectional view of the photoelectric conversion device 300, inclusive of the semiconductor substrate 301, taken along line I-J defined in the plan-view configuration 111 illustrated in FIG. 1B. The sectional configuration 103 taken along line C-D defined in the plan-view configuration 101 illustrated in FIG. 1A substantially corresponds to the configuration illustrated in FIG. 3A. The sectional configuration 112a taken along line E-F defined in the plan-view configuration 111 illustrated in FIG. 1B substantially corresponds to the configuration illustrated in FIG. 3B. Therefore, detailed description of the configurations corresponding to those illustrated in FIGS. 1A and 1B is omitted. Referring to FIGS. 3A, 3B, and 3C, the photoelectric conversion device 300 includes the semiconductor substrate 301, a wire structure 302, a protective layer 303, a planarizing layer 304, a color filter layer 305, and a planarizing layer 306 that are stacked in that order. The microlenses 105 and the monitoring-structure group 110 are provided on the planarizing layer 306. The semiconductor substrate 301 is provided with at least photoelectric conversion elements 307 in the pixel area 202 and is also provided with at least circuit elements 308, such as transistors, in the peripheral area 203 including the monitoring area 204. Referring to FIG. 3A, the pixels 104 are provided in the pixel area 202. Each of the pixels 104 is provided with at least one photoelectric conversion element 307. The pixel 104 has the length W. The circuit elements 308 provided in the monitoring area 204 may be omitted. The wire structure 302 includes a plug including an insulating film, a wire, a contact, and so forth. For example, the wire structure 302 includes a silicon oxide film as an insulating film and a wire chiefly made of copper. The wire may be a stack of a plurality of wire layers. The protective layer 303 suppresses the diffusion of moisture from the outside and impurities from the color filter layer 305 into the semiconductor substrate 301 and includes, for example, a silicon nitride film. The planarizing layer 304 and the planarizing layer 306, which fill and flatten irregularities, may be omitted. The planarizing layer 304 and the planarizing layer 306 are made of an organic material, for example, resin that is spin-coatable. The color filter layer 305 includes filters having different colors. For example, the color filter layer 305 includes, in the pixel area 202, filters having different primary colors that are arranged such that one color is allocated to each pixel 104. The monitoring area 204 is covered with, for example, a blue filter so that light does not enter the circuit elements 308. A portion of the wire structure 302 extending over the monitoring area 204 functions as, for example, a light-shielding film. The microlenses 105 and the monitoring-structure group 110 included in the photoelectric conversion device 300 according to the first embodiment are configured as illustrated in FIGS. 3A, 3B, and 3C. The monitoring structure 115 described above contribute to a reduction in the measurement time and an increase in the measurement accuracy.

The reduction in the measurement time and the increase in the measurement accuracy will now be described in detail. A comparative example will first be described in which the monitoring structure has the same shape as each of the microlenses 105, illustrated in FIG. 1A, provided in the pixel area 202. In the comparative example, the monitoring structure forms a hemisphere. To measure the height of the hemisphere, area scanning (such as raster scanning), in which scanning in the Y direction is performed while scanning in the X direction is performed, needs to be performed with a measuring device such as an AFM so that data on the height in a certain plane is obtained. That is, a plurality of sectional shapes need to be obtained so as to obtain the shape of a section containing the vertex of the hemisphere. In an embodiment of the present invention, the vertex of the microlens is the highest point of the microlens. The vertex may be at the center of the microlens. The microlens may be rotationally symmetric about an axis passing through the vertex. The microlens may have refraction symmetry relative to a plane that passes through the vertex. The microlens may have refraction symmetry relative to two or more planes that intersect the vertex. Therefore, scanning in the X direction needs to be performed a plurality of times. Such a technique takes time. Moreover, since where the section containing the vertex of the hemisphere resides is unclear, whether the correct height of the hemisphere is measured is also unclear and the measurement accuracy is not necessarily high. To increase the measurement accuracy, the spacing of scanning lines needs to be reduced. Consequently, it takes more time.

In contrast, in the first embodiment employing the monitoring structure 115, the height h' corresponding to the height h of the microlenses 105 is measured through one X-direction scanning over the portion 114 of the monitoring structure 115 with a measuring device. Hence, it is not necessary to perform scanning a plurality of times. Moreover, since the height h' corresponding to the height h of the microlenses 105 is assuredly measured, high measurement accuracy is provided. Therefore, using the monitoring structure 115 configured as described above contributes to realizing high measurement accuracy and short measurement time in a case where measurement is performed through scanning with a device such as an AFM.

A method of manufacturing the monitoring structure 115 according to the first embodiment will now be described. The first embodiment concerns a method in which a monitoring-structure group 110 is formed simultaneously with a plurality of microlenses 105 by gray-scale exposure. In particular, an exemplary gray-scale-exposure technique in which an area-coverage-modulation mask is used will be described. Any other mask, such as a halftone mask, may alternatively be used. An area-coverage-modulation mask produces a gray scale by utilizing variations in the density of a microscopic light-shielding pattern that is not resolvable by an exposure apparatus or variations in the area occupied by the microscopic light-shielding pattern. The area-coverage-modulation mask will be described in detail separately below.

The layers up to the planarizing layer 306 illustrated in FIGS. 3A, 3B, and 3C are formed in accordance with a known semiconductor process. Subsequently, a microlens-material layer (a photosensitive-material layer) made of a photosensitive organic material is provided on the planarizing layer 306 over the pixel area 202 and the peripheral area 203. For example, a photosensitive resin is provided by spin coating. Alternatively, the planarizing layer 306 may be omitted and the microlens-material layer may be used for planarization. In that case, exposure is performed on appropriate portions of the microlens-material layer through the area-coverage-modulation mask, and the exposed portions are developed and fired. Through such steps, microlenses 105 and a monitoring-structure group 110 are formed. Subsequently, at least one of monitoring structures 115 included in the monitoring-structure group 110 is observed through an AFM or the like, whereby the shape or height of the microlenses 105 is measured. The shape or height of the microlenses 105 can be obtained by forming the microlenses 105 and the monitoring-structure group 110 on a trial basis under the same conditions employed in the first embodiment and by calculating the correlation between the two. If the height or shape of the microlenses 105 is desirable, the process proceeds to the next step. If the height or shape of the microlenses 105 is not desirable, the microlenses 105 and the monitoring-structure group 110 are removed from the photoelectric conversion device 300 (the semiconductor device). Then, microlenses 105 and a monitoring-structure group 110 are newly formed (reworked), and measurement is performed again. After the remeasurement, steps that are the same as those performed after the first measurement is performed. For example, dicing of the semiconductor wafer 200, illustrated in FIG. 2, is performed, whereby a plurality of photoelectric conversion devices (a plurality of semiconductor devices) is obtained.

Figure 6A:
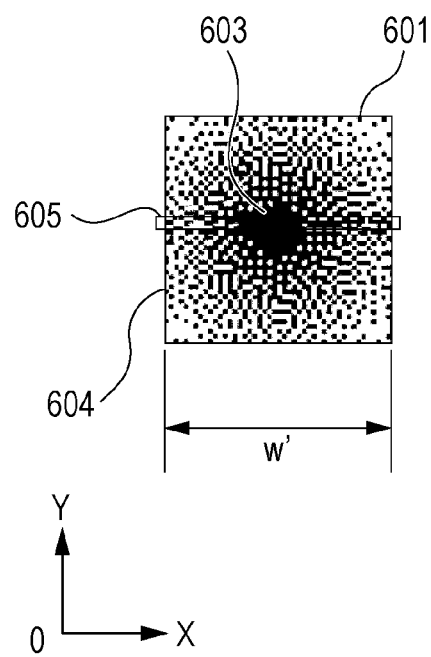
FIG. 6A is a schematic diagram illustrating a light-shielding pattern provided in a photomask and corresponding to one microlens according to the first embodiment.
Figure 6B:
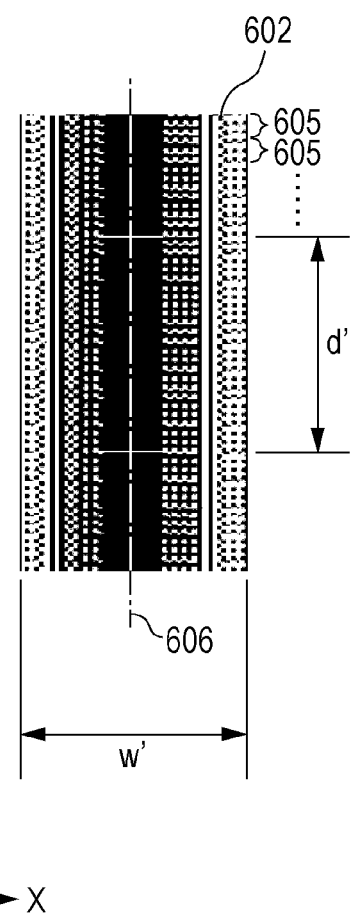
FIG. 6B is a schematic diagram illustrating a light-shielding pattern provided in a photomask and corresponding to one monitoring structure according to the first embodiment.

The area-coverage-modulation mask will now be described with reference to FIGS. 6A and 6B. FIG. 6A illustrates a light-shielding pattern 601 provided in a photomask and corresponding to one microlens 105. In a case where a plurality of microlenses 105 are to be formed as in the first embodiment, a plurality of light-shielding patterns 601 are provided in the photomask. FIG. 6B illustrates a light-shielding pattern 602 provided in a photomask and corresponding to one monitoring structure 115. In a case where a plurality of monitoring structures 115 is to be formed, a plurality of light-shielding patterns 602 is provided in the photomask. In such a case, the plurality of light-shielding patterns 601 and the plurality of light-shielding patterns 602 are provided at two respective positions of one photomask.

Each light-shielding pattern 601 has a distribution of light-shielding dots spreading from a center 603 thereof toward a periphery 604 thereof and with which the amount of transmitted light is adjusted. The light-shielding dots are of sizes that are not resolvable by an exposure apparatus. The distribution of light-shielding dots is set by allocating, to virtual cells that are arranged two-dimensionally, values defining the distribution of the amount of transmitted light that are calculated from the relationship between the shape of the microlens 105 and the sensitivity of the photosensitive material and by binarizing the values in the respective cells. A portion 605 of the light-shielding pattern 601 includes at least one row of cells (arranged in the X direction) containing the center 603. The portion 605 may include two rows of cells.

The light-shielding pattern 602 includes a plurality of portions 605 included in the light-shielding pattern 601 that are repeated one-dimensionally and continuously. Specifically, two rows of cells containing the center 603 of the light-shielding pattern 601 are extracted and are continuously repeated in the Y direction. That is, a virtual line 606 illustrated in the light-shielding pattern 602 lies at a position corresponding to the center 603 of the microlens 105. The light-shielding pattern 601 and the light-shielding pattern 602 designed as described above are provided in the photomask. A length W' is set to such a value that the width of the microlens 105 or the monitoring structure 115 finished through reduction exposure, development, and so forth becomes equal to the length W.

The shape or height of the microlens 105 is measurable by using the monitoring structure 115 formed in accordance with the method described above. Factors that determine the height or the like of the microlens 105 include the thickness of the microlens-material layer, exposure conditions, development conditions, and so forth. In the first embodiment, since the microlenses 105 and the at least one monitoring structure 115 are formed simultaneously, there is provided a highly accurate relationship between the height or the like of each microlens 105 and the height or the like of the monitoring structure 115.

As in the method according to the first embodiment, the monitoring structure can be formed simultaneously with the microlens. In the first embodiment, the microlenses 105 and the at least one monitoring structure 115 are formed simultaneously from one microlens-material layer through exposure, development, and so forth that are each performed with the same timing for the microlenses 105 and for the monitoring structure 115 in a process from the formation of a microlens-material layer to the firing of the microlens-material layer. This is because the heat and light applied to portions of the microlens-material layer that are to become the microlenses 105 can also be applied to portions of the microlens-material layer that are to become the monitoring structure 115. Such a simultaneous manufacturing method makes it easy to form the monitoring structure 115 into a shape correlated with the shape of each microlens 105. Moreover, the monitoring structure 115 can be made of the same material as the microlens 105. Furthermore, the monitoring structure 115 and the microlens 105 can share one photomask and can undergo exposure simultaneously. Thus, the correlation between the shape of the microlens 105 and the shape of the monitoring structure 115 is enhanced. However, the microlens 105 and the monitoring structure 115 are not necessarily formed simultaneously and are not necessarily made of the same material, as long as any correlation between the two can be obtained.

In the case where a plurality of microlenses 105 are provided as in the first embodiment, a plurality of monitoring structures 115 may be provided. This is because, in the process of forming the microlenses 105, the way adjacent portions of the microlens-material layer that are to become the microlenses 105 affect with each other can be made the same as the way adjacent portions of the microlens-material layer that are to become the monitoring structures 115 affect with each other. In such a case, measurement is performed by using some of the monitoring structures 115 excluding the ones at two ends. By employing such an arrangement and a measurement method, more accurate measurement is realized.

To change the height or shape of each monitoring structure 115, the light-shielding pattern 602 may be changed by changing the arrangement of light-shielding dots thereof. In a case where the shape of the monitoring structure 115 is different from the shape of the microlens 105, the correlation between the height or shape of the monitoring structure 115 and the height or shape of the microlens 105 may be obtained in advance. On the basis of the correlation and the result of the measurement of such a monitoring structure, information on the height or shape of an on-chip microlens provided in a pixel area of an image pickup device can be obtained.

As described above, the monitoring structure 115 according to the first embodiment contributes to an increase in the measurement accuracy and a reduction in the measurement time.

Second Embodiment

Figure 4A:
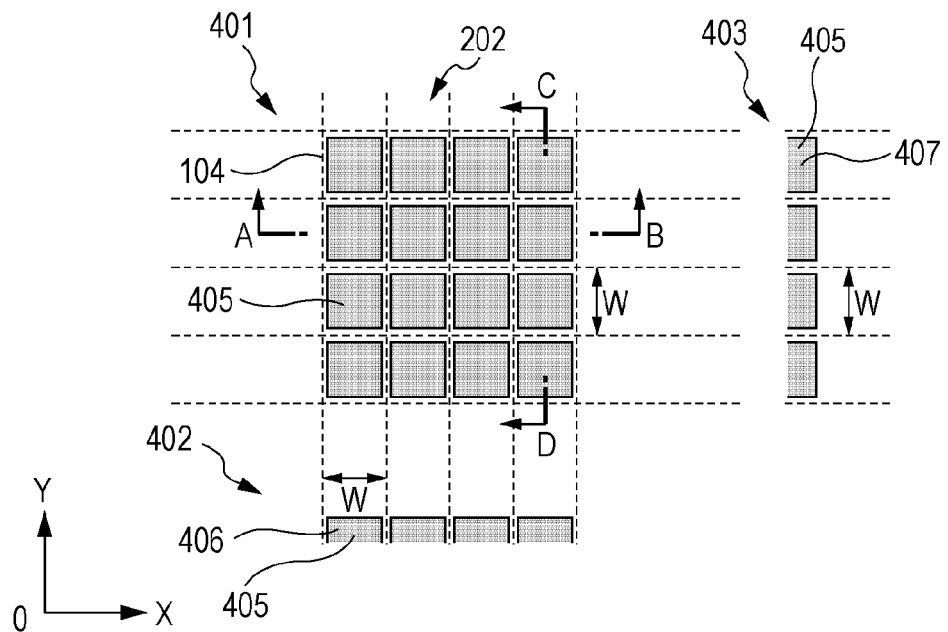
FIG. 4A includes a schematic plan view and schematic sectional views of segments that are to become microlenses according to a second embodiment of the present invention.
Figure 4B:
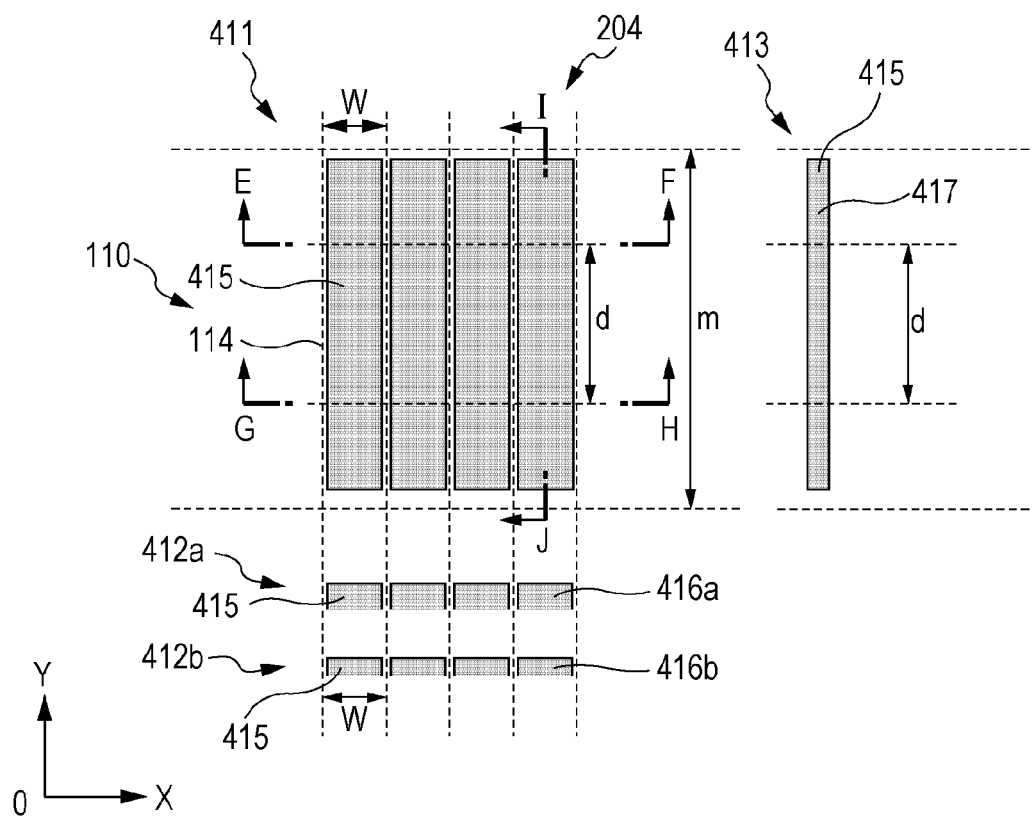
FIG. 4B includes a schematic plan view and schematic sectional views of segments that are to become monitoring structures according to the second embodiment.
Figure 5A:
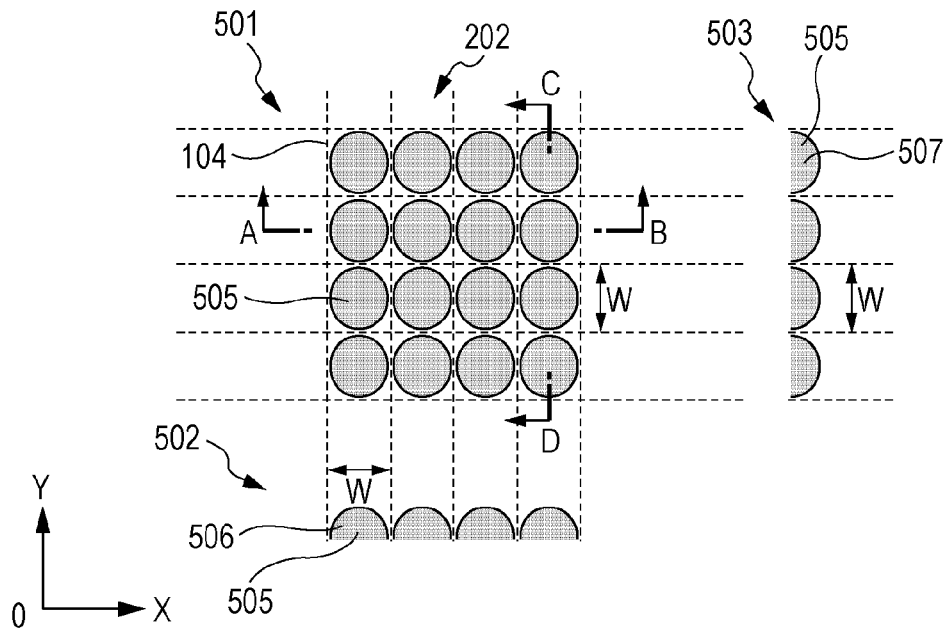
FIG. 5A includes a schematic plan view and schematic sectional views of finished microlenses according to the second embodiment.
Figure 5B:
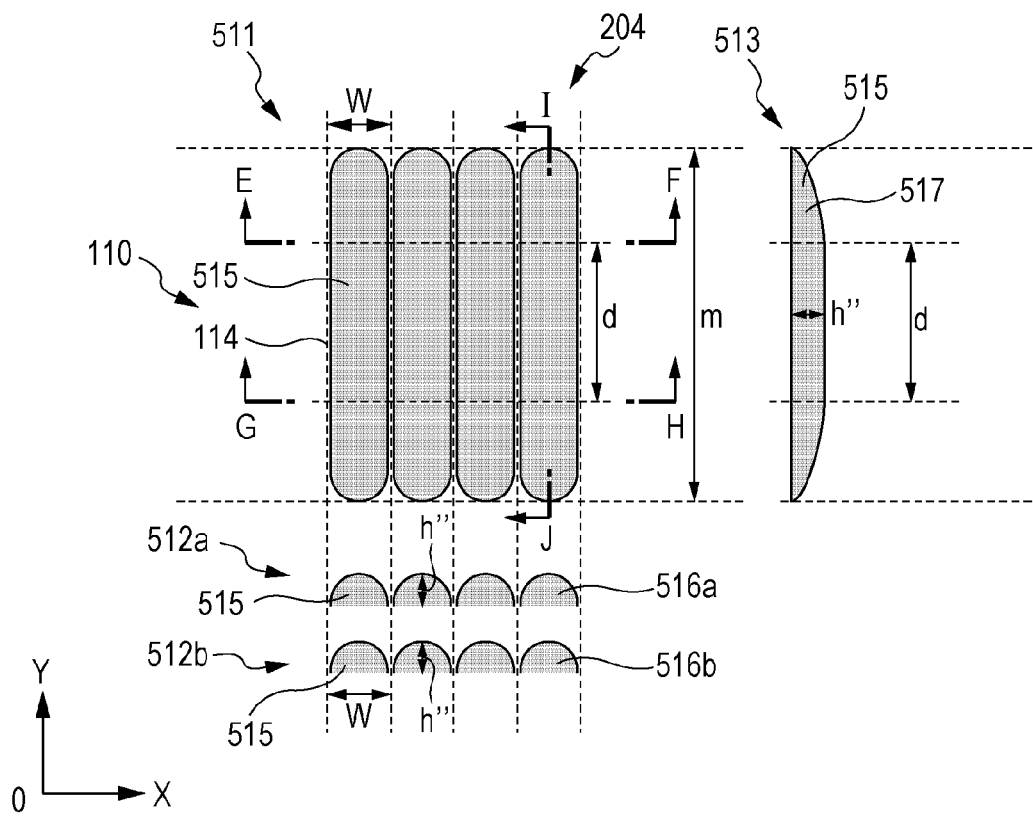
FIG. 5B includes a schematic plan view and schematic sectional views of finished monitoring structures according to the second embodiment.

A manufacturing method according to a second embodiment of the present invention differs from the manufacturing method according to the first embodiment in that the microlens and the monitoring structure are formed by a reflow technique. The second embodiment will now be described with reference to FIGS. 4A, 4B, 5A, and 5B. FIGS. 4A and 4B illustrate segments 405 that are to become microlenses 505 (see FIG. 5A) and segments 415 that are to become monitoring structures 515, respectively. FIGS. 5A and 5B illustrate finished microlenses 505 and finished monitoring structures 515, respectively, obtained from the segments 405 and the segments 415, respectively, illustrated in FIGS. 4A and 4B. Since FIGS. 4A, 4B, 5A, and 5B correspond to FIGS. 1A and 1B, elements that are the same as those illustrated in FIGS. 1A and 1B are denoted by reference numerals used in FIGS. 1A and 1B and description of such elements is omitted.

In a case where microlenses are to be formed by a reflow technique, a microlens-material layer that is photosensitive and organic is provided and is subjected to exposure and development. Subsequently, the resulting body is heated. Thus, microlenses are obtained. Specifically, a microlens-material layer that is photosensitive resin is provided on the planarizing layer 306, illustrated in FIGS. 3A, 3B, and 3C, and is subjected to exposure and development such that the microlens-material layer is patterned into segments each having a desired shape (such as a cylinder or a quadrangular prism). Subsequently, the segments of the patterned microlens-material layer are heated at a temperature at which the segments melt, whereby the segments of the patterned microlens-material layer have curved surfaces.

FIGS. 4A and 4B illustrate the segments 405 and the segments 415, respectively, patterned from the microlens-material layer that have undergone exposure and development and have been formed into desired shapes. The segments 405 illustrated in FIG. 4A are to become the microlenses 505 (see FIG. 5A). The segments 415 illustrated in FIG. 4B are to become the monitoring structures 515 (see FIG. 5B).

Referring to FIG. 4A, the segments 405 that are to become the microlenses 505 each have a rectangular shape in a plan-view configuration 401. Meanwhile, the segments 405 each have a rectangular sectional shape 406 in a sectional configuration 402 taken along line A-B defined in the plan-view configuration 401 and a rectangular sectional shape 407 in a sectional configuration 403 taken along line C-D defined in the plan-view configuration 401. The sectional shape 406 and the sectional shape 407 of the segments 405 each have a length slightly smaller than the length W, unlike the case described in the first embodiment.

Referring to FIG. 4B, the segments 415 that are to become the monitoring structures 515 are provided as illustrated in a plan-view configuration 411. The segments 415 each have a rectangular sectional shape 416a in a sectional configuration 412a taken along line E-F defined in the plan-view configuration 411 and a rectangular sectional shape 416b in a sectional configuration 412b taken along line G-H defined in the plan-view configuration 411. Furthermore, the segments 415 each have a rectangular sectional shape 417 in a sectional configuration 413 taken along line I-J defined in the plan-view configuration 411. The segments 415 are each of a size slightly smaller than the size defined by the length W and the length m.

The segments 405 and the segments 415 illustrated in FIGS. 4A and 4B are heated, whereby the microlenses 505 and the monitoring structures 515 illustrated in FIGS. 5A and 5B are obtained.

The microlenses 505 illustrated in a plan-view configuration 501 in FIG. 5A each have a circular shape with a diameter smaller than the length W. The microlenses 505 are not in contact with one another with gaps interposed therebetween. The microlenses 505 each have a semicircular sectional shape 506 in a sectional configuration 502 taken along line A-B defined in the plan-view configuration 501 and a semicircular sectional shape 507 in a sectional configuration 503 taken along line C-D defined in the plan-view configuration 501. As can be seen from the sectional shape 506 and the sectional shape 507, the microlenses 505 are each of a size smaller than the size defined by the length W, and gaps are interposed between adjacent microlenses 505. That is, the microlenses 505 according to the second embodiment are smaller than the microlenses 105 according to the first embodiment. This is because microlenses formed by a reflow technique cannot retain their hemispherical shapes if formed in such a manner as to be in contact with one another.

The monitoring structures 515, which are included in a monitoring-structure group 510, illustrated in a plan-view configuration 511 in FIG. 5B each have an elliptical plan-view shape that is of a size smaller than the size defined by the length W and the length m. Adjacent monitoring structures 515 are not in contact with one another with gaps interposed therebetween. The monitoring structures 515 each have a semicircular sectional shape 516a in a sectional configuration 512a taken along line E-F defined in the plan-view configuration 511 and a semicircular sectional shape 516b in a sectional configuration 512b taken along line G-H defined in the plan-view configuration 511. The sectional shape 516a and the sectional shape 516b of the monitoring structures 515 each have a length smaller than the length W, and adjacent monitoring structures 515 are not in contact with one another. The sectional shape 516a and the sectional shape 516b are substantially the same. The monitoring structures 515 each have a sectional shape 517 in a sectional configuration 513 taken along line I-J defined in the plan-view configuration 511. The sectional shape 517 has a rectangular shape with curved ends and includes a portion 514 defined by a length d and a constant height h". That is, the monitoring structures 515 each has a constant cross-sectional shape in the portion 514, as with the monitoring structures 115 according to the first embodiment.

As described above, the monitoring structure according to the present invention can be formed by a reflow technique described in the second embodiment.

In addition, etching may be performed by using the microlenses 505 and the monitoring structures 515 formed in accordance with the method according to the second embodiment as a mask. Specifically, before providing a first microlens-material layer, a second microlens-material layer is provided. Subsequently, while the first microlens-material layer, which has the microlenses 505 and the monitoring structures 515 formed in accordance with the method according to the second embodiment, is used as a mask, the shapes of the microlenses 505 and the monitoring structures 515 are transferred to the second microlens-material layer by etching. Microlenses and monitoring structures can also be formed by such a method. In such a method, adjacent microlenses and adjacent monitoring structures can be provided in contact with one another as in the first embodiment. Since the microlenses are in contact with one another, the light-collection efficiency increases. Moreover, in a case of a photoelectric conversion device, the sensitivity increases.

Third Embodiment

A third embodiment of the present invention will now be described with reference to FIGS. 7A, 7B, 7C, 8A, 8B, and 8C. In the third embodiment, the shape of the microlens and the shape of the monitoring structure are varied.

Figure 7A:
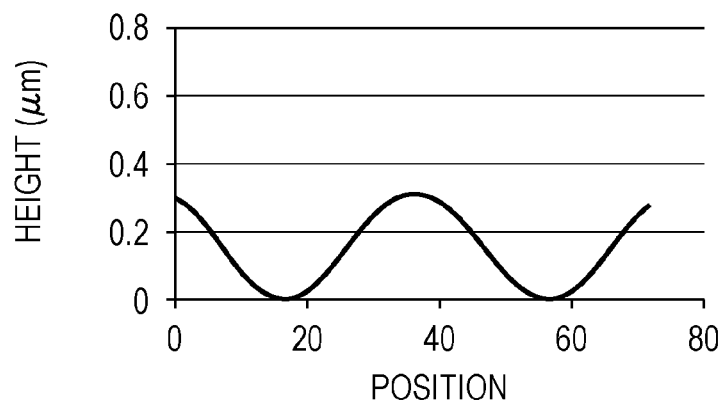
FIG. 7A is a graph illustrating a sectional shape of monitoring structures that is measured in a third embodiment of the present invention.
Figure 7B:
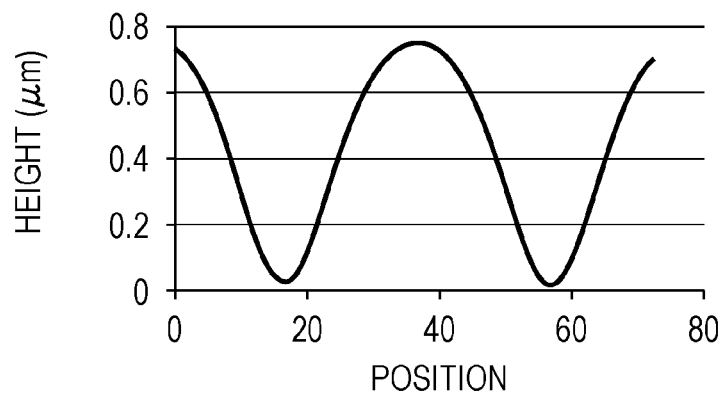
FIG. 7B is a graph illustrating another sectional shape of monitoring structures that is measured in the third embodiment.
Figure 7C:
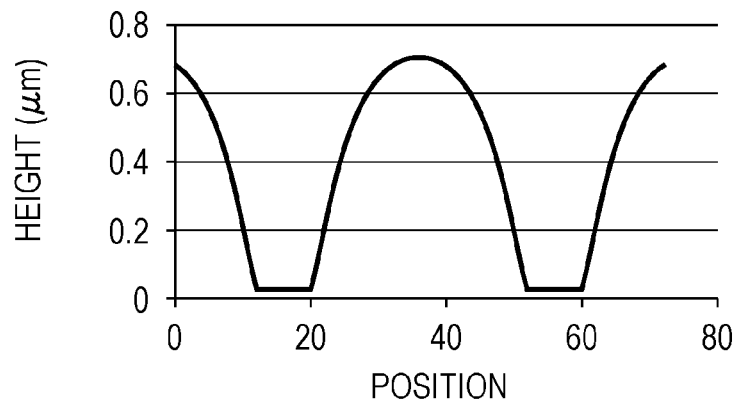
FIG. 7C is a graph illustrating yet another sectional shape of monitoring structures that is measured in the third embodiment.

FIGS. 7A, 7B, 7C are graphs illustrating the results of measuring, with an AFM, the sectional shape of different monitoring structures formed by the method according to the first embodiment. In each of FIGS. 7A, 7B, and 7C, the horizontal axis represents the position, and the vertical axis represents the height (μm). FIG. 7B illustrates a case where the monitoring structures each have a reference shape with the height h' thereof being equal to the height h of the microlenses. FIG. 7A illustrates a case where the height h' of the monitoring structures is smaller than that in the case illustrated in FIG. 7B. FIG. 7C illustrates a case where the gap between adjacent ones of the monitoring structures is larger than that in the case illustrated in FIG. 7B.

Figure 8A:
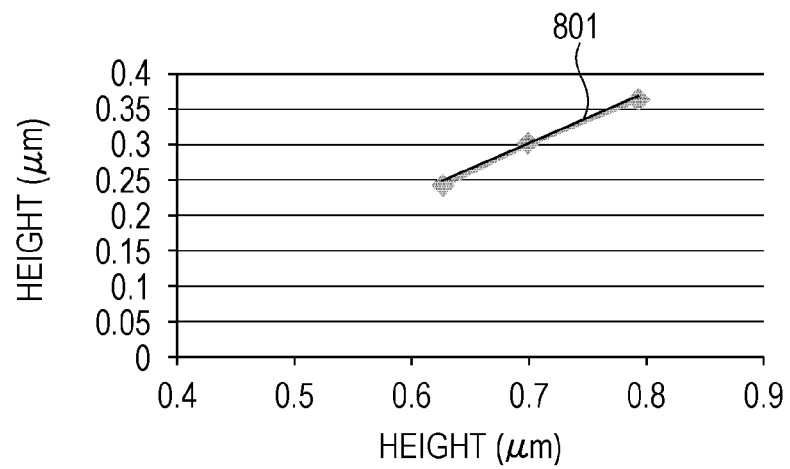
FIG. 8A is a graph illustrating a relationship between the shape of the microlens and the shape of the monitoring structure that is obtained in the third embodiment.
Figure 8B:
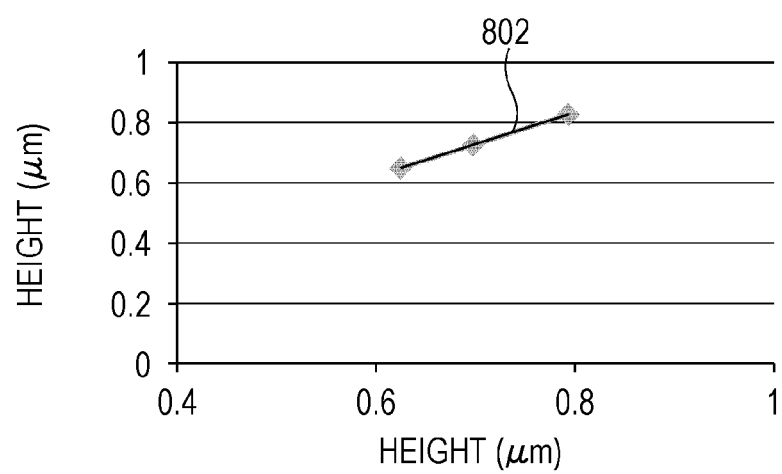
FIG. 8B is a graph illustrating another relationship between the shape of the microlens and the shape of the monitoring structure that is obtained in the third embodiment.
Figure 8C:
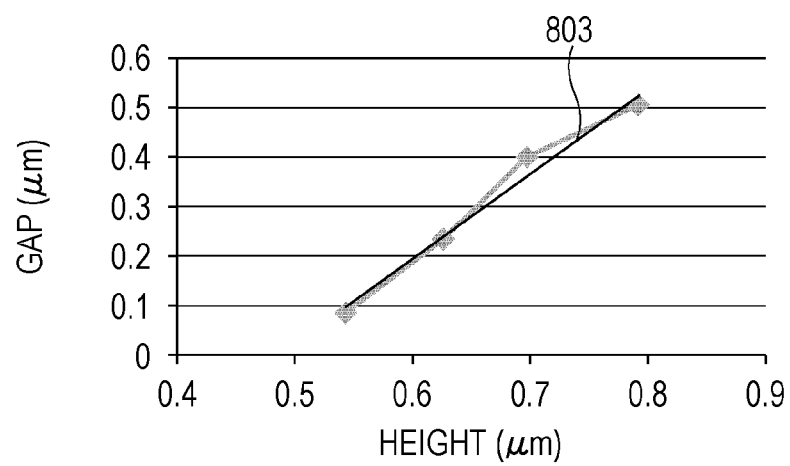
FIG. 8C is a graph illustrating yet another relationship between the shape of the microlens and the shape of the monitoring structure that is obtained in the third embodiment.

FIGS. 8A, 8B, and 8C are graphs illustrating relationships between the monitoring structures having the respective shapes illustrated in FIGS. 7A, 7B, and 7C and the microlenses. In FIG. 8B, the vertical axis represents the height (μm) of the monitoring structures having the shape illustrated in FIG. 7B, and the horizontal axis represents the height (μm) of the microlenses. The height h of the microlenses and the height h' of the monitoring structures are varied by varying the exposure conditions, specifically, by increasing and decreasing the exposure value, in the method according to the first embodiment. In the case illustrated in FIG. 8B, when the height h of the microlenses increases, the height h' of the monitoring structures also increases. Furthermore, when the height h of the microlenses decreases, the height h' of the monitoring structures also decreases. The relationship between the height h of the microlenses and the height h' of the monitoring structures is represented by a straight line coinciding with an approximate line 802. In this case, there is a strong correlation between the height h of the microlenses and the height h' of the monitoring structures. Therefore, the height and the shape of the microlenses can be measured with high accuracy.

In FIG. 8A, the vertical axis represents the height h' of the monitoring structures having the shape illustrated in FIG. 7A, and the horizontal axis represents the height h of the microlenses. The graph illustrated in FIG. 8A shows the same tendency as the graph illustrated in FIG. 8B, except that the height h' of the monitoring structures is lower than that of the reference monitoring structures illustrated in FIG. 7B. Even in such a case where the height h of the microlenses is not equal to the height h' of the monitoring structures, the height h of the microlenses increases and decreases with the height h' of the monitoring structures. The relationship between the height h of the microlenses and the height h' of the monitoring structures is represented by a straight line coinciding with an approximate line 801, showing that there is a correlation between the two. Hence, the height h of the microlenses and the height h' of the monitoring structures may be different from each other.

In FIG. 8C, the vertical axis represents the gap between adjacent ones of the monitoring structures having the shape illustrated in FIG. 7C, and the horizontal axis represents the height h of the microlenses. In the case illustrated in FIG. 8C, the height h of the microlenses is varied by varying the exposure value, as in the case illustrated in FIG. 8B, except that the gap between adjacent ones of the monitoring structures is larger than that in the case of the reference monitoring structures illustrated in FIG. 7B. In the case illustrated in FIG. 8C, variations in the gap correspond to variations in the height h of the microlenses, and the relationship between the two is represented by a substantially straight line almost coinciding with an approximate line 803. This shows that there is a correlation between the gap between adjacent ones of the monitoring structures and the height h of the microlenses. Even if the size of the gap is varied, a correlation between the height h' of the monitoring structures and the height h of the microlenses is observed, although not described in the third embodiment.

FIGS. 8A, 8B, and 8C show that there is a correlation in which the height h' of the monitoring structures or the gap between adjacent ones of the monitoring structures changes with the height h of the microlenses provided in the pixel area 202. Since the height h of the microlenses can be calculated from such a correlation, high measurement accuracy is realized.

In the case illustrated in FIGS. 7C and 8C in which a plurality of monitoring structures are provided with gaps interposed therebetween, the height h of the microlenses can be measured by measuring the gaps through a scanning electron microscope (SEM), instead of a measuring device such as an AFM.

If the microlenses each include an antireflection film (if a base member of the microlenses is covered with an antireflection film), the monitoring structures may also each include the same antireflection film. In that case, the correlation between the shapes or dimensions of the microlenses and the monitoring structures is increased.

In a semiconductor device including the monitoring structures described above, both measurement time and measurement errors are reduced. The present invention is not limited to the above embodiments. The above embodiments may be combined in any way. The semiconductor device according to the present invention is not limited to a photoelectric conversion device, such as a solid-state image pickup device, and may be any other device including microlenses, such as a display device.

The arrangement of the microlenses and the pixels according to the present invention is not limited to an arrangement in which one microlens is provided for each of the pixels, and may be any other arrangement in which one microlens is provided for a plurality of pixels or a plurality of microlenses are provided for each of the pixels. The above embodiments concern a case where at least one monitoring structure is provided. That is, one monitoring structure may be provided for one or more microlenses or a plurality of monitoring structures may be provided for one or more microlenses. Nevertheless, if a plurality of microlenses are provided, a plurality of monitoring structures are desirably provided.

This is because the way adjacent portions of the microlens-material layer that are to become the microlenses affect with each other can be made the same as the way adjacent portions of the microlens-material layer that are to become the monitoring structures affect with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-223300 filed Oct. 7, 2011, which is hereby incorporated by reference herein in its entirety.

What is claimed is:

1. A semiconductor device comprising:
a plurality of pixels provided in a pixel area at a pitch of a length W;
a plurality of microlenses provided in the pixel area in correspondence with the plurality of pixels respectively;
a monitoring structure provided in a peripheral area separated from the pixel area, and
a color filter layer provided below the microlens and the monitoring structure, wherein the color filter layer includes filters having different colors in the pixel area, and the color filter layer includes only a blue filter in the peripheral area;
wherein the monitoring structure includes a portion having a shape correlated with a shape of each of the plurality of microlenses and extending along a predetermined direction,
wherein each of the plurality of microlenses has a first curved surface in a first direction orthogonal to the predetermined direction and in a second direction parallel to the predetermined direction,
wherein a shape of a section of the portion of the monitoring structure that is taken in a plane orthogonal to the predetermined direction is constant for a length d which is larger than the length W, along the predetermined direction,
wherein the shape of the section of the portion of the monitoring structure has a second curved surface, and
wherein the monitoring structure is formed so that a height of the monitoring structure has a correlation with a height of the plurality of microlenses.

2. The semiconductor device according to claim 1, wherein the monitoring structure and the microlens are made of the same material.

3. The semiconductor device according to claim 1, wherein the section of the portion of the monitoring structure has the same shape as a section of the microlens that contains a vertex of the microlens.

4. The semiconductor device according to claim 1,
wherein a width of the portion is smaller than the length d, and a length of the monitoring structure in the predetermined direction is larger than the length d, and
wherein each of the plurality of pixels is provided with at least one photoelectric conversion element.

5. The semiconductor device according to claim 1,
wherein the monitoring structure is one of a plurality of monitoring structures, and
wherein a gap between the microlens and another microlens adjacent to the microlens is equal to a gap between the monitoring structure and another monitoring structure adjacent to the monitoring structure.

6. The semiconductor device according to claim 1, wherein the monitoring structure has a semicylindrical shape whose axis extends parallel to the predetermined direction.

7. The semiconductor device according to claim 1, wherein the monitoring structure has a shape of a cylindrical lens.

8. The semiconductor device according to claim 1, wherein a shape or height of the monitoring structure has been measured by scanning the monitoring structure with a measuring device in a direction orthogonal to the predetermined direction.

9. A wafer comprising:
a plurality of pixel areas, each of which comprises a plurality of pixels arranged at a pitch of a length W;
a plurality of microlenses provided in each of the pixel area in correspondence with the plurality of pixels respectively;
a monitoring structure provided in a monitoring area, the monitoring area being included in a peripheral area between one of the plurality of pixel areas and another one of the plurality of pixel areas; and
a color filter layer provided below the microlens and the monitoring structure, wherein the color filter layer includes filters having different colors in the pixel area, and the color filter layer includes only a blue filter in the peripheral area;
wherein the monitoring structure includes a portion having a shape correlated with a shape of a microlens of plurality of microlenses and extending along a predetermined direction,
wherein each of the plurality of microlenses has a first curved surface in a first direction orthogonal to the predetermined direction and in a second direction parallel to the predetermined direction,
wherein a shape of a section of the portion of the monitoring structure that is taken in a plane orthogonal to the predetermined direction is constant for a length d which is larger than the length W, along the predetermined direction,
wherein the shape of the section of the portion of the monitoring structure has a second curved surface, and
wherein the monitoring structure is formed so that a height of the monitoring structure has a correlation with a height of the plurality of microlenses.

10. The wafer according to claim 9, wherein a shape or height of the monitoring structure has been measured by scanning the monitoring structure with a measuring device in a direction orthogonal to the predetermined direction.

11. The wafer according to claim 9,
wherein a width of the portion is smaller than the length d, and a length of the monitoring structure in the predetermined direction is larger than the length d, and
wherein each of the plurality of pixels is provided with at least one photoelectric conversion element.

12. A semiconductor device comprising:
a plurality of pixels provided in a pixel area at a pitch of a length W;
a plurality of microlenses provided in the pixel area in correspondence with the plurality of pixels; and
a structure provided in a peripheral area separated from the pixel area,
wherein the structure includes a portion having a shape correlated with a shape of each of the plurality of microlenses and extending along a predetermined direction,
wherein each of the plurality of microlenses has a first curved surface in a first direction orthogonal to the predetermined direction and in a second direction parallel to the predetermined direction, wherein a shape of a section of the portion of the structure that is taken in a plane orthogonal to the predetermined direction is constant for a length d which is larger than the length W, along the predetermined direction, and wherein the shape of the section of the portion of the structure has a second curved surface, and wherein the height of the structure is equal to the height of the plurality of microlenses.

13. A semiconductor device comprising:

a plurality of pixels provided in a pixel area at a pitch of a length W;

a plurality of microlenses provided in the pixel area in correspondence with the plurality of pixels respectively; and a monitoring structure provided in a peripheral area separated from the pixel area, wherein the monitoring structure includes a portion having a shape correlated with a shape of each of the plurality of microlenses and extending along a predetermined direction, wherein each of the plurality of microlenses has a first curved surface in a first direction orthogonal to the predetermined direction and in a second direction parallel to the predetermined direction, wherein a shape of a section of the portion of the monitoring structure that is taken in a plane orthogonal to the predetermined direction is constant for a length d which is larger than the length W, along the predetermined direction, wherein the shape of the section of the portion of the monitoring structure has a second curved surface, and wherein the monitoring structure is formed so that a height of the monitoring structure is substantially equal to a height of the plurality of microlenses.

14. A wafer comprising a plurality of pixel areas, each of which comprises a plurality of pixels arranged at a pitch of a length W;

a plurality of microlenses provided in each of the pixel area in correspondence with the plurality of pixels respectively; and a monitoring structure provided in a monitoring area, the monitoring area being included in a peripheral area between one of the plurality of pixel areas and another one of the plurality of pixel areas, wherein the monitoring structure includes a portion having a shape correlated with a shape of a microlens of plurality of microlenses and extending along a predetermined direction, wherein each of the plurality of microlenses has a first curved surface in a first direction orthogonal to the predetermined direction and in a second direction parallel to the predetermined direction, wherein a shape of a section of the portion of the monitoring structure that is taken in a plane orthogonal to the predetermined direction is constant for a length d which is larger than the length W, along the predetermined direction, wherein the shape of the section of the portion of the monitoring structure has a second curved surface, and wherein the monitoring structure is formed so that a height of the monitoring structure is equal to a height of the plurality of microlenses.

* * * * *